(12) United States Patent
Hibino et al.

(10) Patent No.: US 6,479,874 B2
(45) Date of Patent: *Nov. 12, 2002

(54) SEMICONDUCTOR MEMORY DEVICE HAVING MULTILEVEL MEMORY CELL AND METHOD OF MANUFACTURING THE SAME

(75) Inventors: Kenji Hibino, Tokyo (JP); Masao Kunitou, Tokyo (JP); Kazuyuki Yamasaki, Tokyo (JP); Tetsuji Togami, Tokyo (JP); Hironori Sakamoto, Tokyo (JP); Kiyokazu Hashimoto, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/161,510

(22) Filed: Sep. 28, 1998

(65) Prior Publication Data

US 2001/0042893 A1 Nov. 22, 2001

(30) Foreign Application Priority Data

Oct. 1, 1997 (JP) ............................................. 9-269053

(51) Int. Cl.$^7$ ......................... H01L 29/76; G11C 16/04; G11C 16/06
(52) U.S. Cl. .................. 257/390; 257/391; 365/189.07; 365/185.03; 365/185.2
(58) Field of Search ................................ 257/390, 391, 257/393; 438/278, 290, 130, 275, 283, 276, 277, 279; 365/189.07, 185.03, 185.2

(56) References Cited

U.S. PATENT DOCUMENTS

| 5,377,153 | A | * | 12/1994 | Guritz et al. | 365/189.07 |
| 5,464,989 | A | * | 10/1995 | Mori et al. | 257/30 |
| 5,526,306 | A | * | 6/1996 | Hikawa et al. | 365/182 |
| 5,583,808 | A | * | 12/1996 | Brahmbhatt | 365/185.05 |
| 5,753,553 | A | * | 5/1998 | Hikawa et al. | 138/278 |
| 5,793,690 | A | * | 8/1998 | Iwahashi | 365/185.09 |
| 5,877,537 | A | * | 3/1999 | Aoki | 257/330 |
| 5,949,101 | A | * | 9/1999 | Aritome | 257/315 |
| 6,075,725 | A | * | 6/2000 | Choi et al. | 365/185.03 |
| 6,137,726 | A | * | 10/2000 | Choi et al. | 365/185.24 |
| 6,181,625 | B1 | * | 1/2001 | Hibino | 365/189.09 |

FOREIGN PATENT DOCUMENTS

JP            9-55094            2/1997

* cited by examiner

Primary Examiner—Wael Fahmy
Assistant Examiner—Brook Kebede
(74) Attorney, Agent, or Firm—McGinn & Gibb, PLLC

(57) ABSTRACT

A semiconductor ROM device which enables to obtain a reference current which can securely distinguish data stored in a memory cell in a multilevel mask ROM for storing multilevel data of three or more levels per memory cell. The device comprises a memory cell in which a threshold voltage is set up corresponding to an amount of ions injected to a channel region of a cell transistor and multilevel data of three or more levels are stored, a reference cell for generating the reference current for comparing with a current read out from the memory cell, and dummy cells disposed adjacent to the reference cell. In the channel region of the reference cell and the channel region of the dummy cell, ions are injected simultaneously to set up the equal threshold voltages both in the reference cell and the dummy cell.

9 Claims, 7 Drawing Sheets

SEMICONDUCTOR MEMORY DEVICE HAVING MULTILEVEL MEMORY CELL AND METHOD OF MANUFACTURING THE SAME

BACKGROUND OF THE INVENTION

1. Field of the Invention

The present invention relates to a semiconductor memory device, and more particularly to a multilevel mask ROM (Read Only Memory) of an ion implantation type in which each memory cell stores multilevel data.

2. Description of the Prior Art

A mask ROM is also called a fixed ROM, and by using a mask including user data upon a wafer fabrication process, the mask ROM is manufactured having the data stored therein. In the mask ROM, individual data are stored in memory cells each composed of a piece of cell transistor. Formerly, the memory cell was arranged to store binary data "0" or "1" according to a state of whether a bit line was connected or not connected to the cell transistor. However, recently, the technique in which the threshold voltage $V_{th}$ of each the cell transistor generally made of a MOS (Metal-Oxide-Semiconductor) FET (Field Effect Transistor) is adjusted by using such as an ion implantation technique to make each cell transistor store adjusted binary data, thereby increasing a storage capacity of a mask ROM. In case of the mask ROM which stores data by changing the threshold voltage $V_{th}$ in this way, a reference cell of the same structure as the memory cell which stores data is provided in the ROM in advance, and a reference current to be obtained from the reference cell and a current which flows in the memory cell at a read time are compared to reproduce the binary data.

Moreover, for the purpose of further increasing the storage capacity, a technique has been developed lately in which a plurality of bit data can be stored in each memory cell by making each memory cell store one of the multilevel data of three or more levels. A mask ROM in which each memory cell is arranged to store multilevel data of three or more levels in this way is called a multilevel mask ROM.

In the multilevel mask ROM, the threshold voltage $V_{th}$ of the cell transistor of each memory cell is changed by ion implantation according to multilevel data to be stored in the memory cell. If the write data to be input to each memory cell is the data of N-level, a threshold voltage corresponding to the write data is selected from among threshold voltages of N kinds and set in the cell transistor of the memory cell. In this multilevel mask ROM, N−1 pieces of reference cells having different threshold voltages are provided beforehand. The structure of the reference cell is identical to that of the memory cell, and a current which flows in the memory cell at the read time and a reference current to be obtained from each reference cell are compared to reproduce the multilevel data. The reference current is compared as a criterion for distinguishing data with a current which flows when the cell transistor of the memory cell is switched on with its threshold voltage.

For example, if it is assumed that N=4, threshold voltages for the cell transistor of the memory cell are $V_{r0}$ to $V_{r3}$, and $V_{r0}<V_{r1}<V_{r2}<V_{r3}$, then the threshold voltages of the cell transistors of the reference cells are set to the same threshold voltages $V_{r0}$ to $V_{r2}$, respectively, as those of the cell transistors of the memory cells. The reference current is set by providing a predetermined offset by means of such as a known offset circuit so that th e reference current becomes approximately an intermediate value of each current which flows whe n the memory cell is switched on with each threshold voltage.

Since the predetermined data is stored by changing the threshold voltage of the cell transistor made of a MOSFET through an ion implantation process, the ion implantation process is also called code ion implantation process.

FIG. 1 is a block diagram showing the general structure of a multilevel mask ROM. Here, the multilevel mask ROM is a 4-level mask ROM in which each memory cell stores one of 4-level data.

The multilevel mask ROM comprises memory cell 21 for storing data, sense amplifier 22 for reading data from memory cell 21, a first, second and third reference cells 23a to 23c to be used as criteria against memory cell 21, a first, second and third reference amplifiers 24a to 24c for producing reference currents by using reference cells 23a to 23c, respectively, comparison circuit 25 for discriminating data stored in memory cell 21 by comparing the output of sense amplifier 22 and the output of each of reference amplifiers 24a to 24c, and logic synthesis circuit 26 for outputting 2-bit data through logic synthesis of the output result of comparison circuit 25. Here, the reference current is the current which serves as the criterion for distinguishing data stored in memory cell 21. In FIG. 1, although there is illustrated only one memory cell 21, a plurality of memory cells are actually disposed as a memory cell array, and by receiving an address from the outside, a memory cell corresponding to the address is selected. As a result, sense amplifier 22 reads the data from the selected memory cell to output it to comparison circuit 25.

Memory cell 21 and reference cells 23a to 23c each has a cell transistor made of a MOSFET, having the same structure. The threshold voltage of the cell transistor can be set to a desired value by changing the amount of ion to be injected to a channel region provided directly under the gate o f the cell transistor. Now, since the 4-level mask ROM is taken into consideration, memory cell 21 is set to any one of threshold voltages of $V_{r0}$, $V_{r1}$, $V_{r2}$ and $V_{r3}$ (where $V_{r0}<V_{r1}<V_{r2}<V_{r3}$) corresponding to its data stored. In order to distinguish these data of 4-level, the threshold voltages of cell transistors of a first, second and third reference cells 23a to 23c are set to $V_{r0}$, $V_{r1}$ and $V_{r2}$, respectively.

Further, with reference to a first, second and third reference amplifiers 24a to 24c, prescribed offsets are provided respectively so that the respective reference currents become approximately the mean value of the currents which flow when the cell transistor of memory cell 21 is switched on with respective threshold voltages. Here, $V_{r0}$ is the threshold voltage of the cell transistor when no ions are injected to the channel region directly under the gate.

In the 4-level mask ROM of a like structure, for reproducing the data, the output of sense amplifier 22 and the output of the first reference amplifier 24a are first compared by comparison circuit 25. At this time, if the output of sense amplifier 22 is smaller than the output of the first reference amplifier 24a, it is determined that the threshold voltage of the corresponding memory cell 21 is $V_{r0}$. Then, comparison circuit 25 compares the output of sense amplifier 22 and the output of the second reference amplifier 24b, and when the output of sense amplifier 22 is between the output of the first reference amplifier 24a and the output of the second reference amplifier 24b, the threshold voltage of that memory cell 21 is determined as $V_{r1}$, Next, comparison circuit 25 compares the output of sense amplifier 22 and the output of the third reference amplifier 24c, and when the output of sense amplifier 22 is between the output of the second reference amplifier 24*b* and the output of the third reference amplifier 24*c*, the threshold voltage of that memory cell 21 is determined as $V_{r2}$. When the output of sense amplifier 22 is larger than the output of the third reference amplifier 24*c*, the threshold voltage of that memory cell 21 is determined as $V_{r3}$. By distinguishing the respective threshold voltages of memory cell 21 in this way, data stored in memory cell 21 can be reproduced. Here, description has been made with reference to the successive comparison made by comparison circuit 25 between the output of sense amplifier 22 and the output of each of reference amplifiers 24*a* to 24*c*, however, of course it is possible to prepare a circuit which allows parallel comparison.

By the way, in the semiconductor memory device such as a mask ROM, miniaturization of memory cells has progressed recently in proportion to the increase of the storage capacity thereof. With reference to the mask ROM of this sort, it is known that electric currents flow in the cell transistor are reduced by reason of being influenced by the write state of data written in memory cells disposed in the vicinity of the cell transistor. Therefore, the value of the reference current must be set to a value which can certainly distinguish the data even if the current which flows in memory cell 21 is minimum, that is, in the worst case condition (minimum).

As a technique for setting the value of the reference current in an optimum manner, Japanese Patent Laid-open No. 55094/1997 (JP, A, 09055094) has disclosed the technique, although it concerns binary (2-level) mask ROM. According to this technique, dummy cells are disposed around the reference cell provided in the 2-level mask ROM, each dummy cell having the cell transistor injected with ions in the channel region, thereby enabling the mask ROM to certainly correspond to the data even if the currents which flow in the memory cell is in the worst condition.

The structure of the reference cell and a method of manufacturing the reference cell will be described with reference to 4-level mask ROM as an example for the case when the reference cell of the multilevel mask ROM is manufactured by applying the technique disclosed in Japanese Patent Laid-open Gazette No. 55094/1997.

FIGS. 2 and 3 are views showing the structure of the region of such a 4-level mask ROM in which the reference cell is disposed, FIG. 2 being a plan showing the structure of the reference cell region, and FIG. 3 being a sectional side elevation viewed from the III–III' line of FIG. 2. Further, FIGS. 4A to 4D are plans explaining, in order, the manufacturing process of the reference cell shown in FIGS. 2 and 3.

In FIGS. 2 and 3 the mask ROM comprises a plurality of parallelly disposed buried diffusion layers 13 made of n⁺-type silicon layer provided on p-type silicon substrate 19, and gate lines 14 made of polysilicon disposed orthogonally to buried diffusion layer 13. Further, buried diffusion layer 13 serves as a source region and a drain region of a cell transistor (MOSFET) and gate line 14 serves as a gate electrode of the cell transistor. Since buried diffusion layers 13 and gate lines 14 are disposed in a form of a lattice, the cell transistors are disposed in a matrix form. FIG. 2 illustrates nine pieces of cell transistors, and the cell transistor disposed at the center of them becomes reference cell 11. In channel region 15 provided directly under the gate of reference cell 11, ions are injected to set a desired threshold voltage to reference cell 11. In FIG. 2, each of eight cell transistors surrounding reference cell 11 is dummy cell 12. As a result, dummy cells 12 each formed to the same structure as reference cell 11 are disposed around reference cell 11. Further, between gate line 14 and channel region 15, and between gate line 14 and buried diffusion layer 13, oxide films 16 are provided for insulating them.

It is noted that cell transistors are disposed in a form of a matrix in this way commonly in a floor of the ask ROM including a region in which the reference cells are disposed and another region in which the memory cell array is disposed. However, dummy cells are disposed surrounding the reference cell in the reference cell region, while on the contrary in the memory cell array region, cell transistors construct memory cells respectively without having dummy cells.

Here, in this multilevel mask ROM, the highest threshold voltage is set to the cell transistor of dummy cell 12 among respective cell transistors in the region where the reference cell is provided. As shown in FIG. 3, when ions are injected into channel region 15 through the gate of the cell transistor, the ions diffuse into buried diffusion layer 13 which serves as a source region and a drain region of the cell transistor, thereby increasing the electric resistance of buried diffusion layer 13. Since the resistance of buried diffusion layer 13 increases as the ion injection quantity becomes larger, if ion injection amount of dummy cell 12 is set to a value which allows the threshold voltage to become the highest, a minimum current is caused to flow in reference cell 11. Consequently, the reference current then becomes equal to the minimum cell current of each memory cell of the memory cell array, and hence an operation margin of sense amplifier 22 or comparison circuit 25 are secured. In other words, a memory cell having the least cell current among memory cells of the memory cell array is reproduced by this reference cell 11. Generally, sense amplifier 22 or comparison circuit 25 is designed to make the reference current thereof coincide with the minimum value of the cell current of the memory cell. Therefore, when the reference current grows larger than the cell current of the memory cell, the operation margin of sense amplifier 22 becomes insufficient. If the power source is in the upper direction and the ground potential is in the lower direction of FIG. 2, a path of the current which flows in reference cell 11 becomes, for example, like current path 17 shown in FIG. 2.

For example, when the threshold voltage of the cell transistor of reference cell 11 is set to $V_{r1}$, in the conventional 4-level mask ROM, ions are injected into reference cell 11 to make the threshold voltage $V_{r1}$ and dummy cell 12 to make the highest threshold voltage $V_{r3}$.

A manufacturing process of the reference cell shown in FIGS. 2 and 3 will next be described with reference to FIGS. 4A to 4D. The following description will be made, for example, with reference to the case in which the threshold voltage of reference cell 11 is set to $V_{r1}$. The region of FIGS. 4A to 4D attached with cross hatching each shows that ion implantation is applied thereto in the corresponding stage.

As described above, in the 4-level mask ROM, reference cells having threshold voltages set to $V_{r0}$, $V_{r1}$ and $V_{r2}$, respectively, are provided. FIGS. 4A to 4D each shows only the reference cell in which the threshold voltage is set to $V_{r1}$, and reference cells having threshold voltages set to $V_{r0}$ and $V_{r2}$ are provided outside the regions shown in FIGS. 4A to 4D. When the threshold voltage is set to $V_{r2}$, ions are injected in a second ion implantation process later described to form the reference cell. When the threshold voltage is set to $V_{r0}$, ion implantation is not performed to the reference cell.

In this case, as shown in FIG. 4A, buried diffusion layer 13 and oxide film 16 are first formed on silicon substrate 19 to form the mask ROM substrate. At this stage, no ion implantation is applied to channel region 15. A resist film for ion implantation having an opening prepared corresponding to reference cell 11 is formed on the mask ROM substrate. Next, as shown in FIG. 4B, ions are injected into channel region 15 (see FIG. 3) by an amount required for setting the threshold voltage to $V_{r1}$ thereby forming reference cell 11.

Here, the ion implantation process for setting the threshold voltage to $V_{r1}$ is called a first ion implantation process. Successively, a second ion implantation process for setting the threshold voltage to $V_{r2}$ is performed in the same way as the first ion implantation process. Since the threshold voltage of reference cell 11 shown in FIGS. 4A to 4D is set to $V_{r1}$, the resist film formed on the region has no opening, and as shown in FIG. 4C, no ions are injected in this region through the second ion implantation process. Finally, on the mask ROM substrate for which the second ion implantation process is finished, a resist film to be used in ion implantation is formed being provided with an opening corresponding to dummy cell 12, and as shown in FIG. 4D, a required amount of ions for setting the threshold voltage to $V_{r3}$ is injected to channel region 15, thereby forming dummy cells 12. The ion implantation process for setting the threshold voltage to $V_{r3}$ is called a third ion implantation process. Thereafter, gate electrode 14 is formed to complete the mask ROM.

The first, second and third ion implantation processes described above are also the ion implantation processes for writing desired data into respective memory cells in the memory cell array shown FIG. 1. Memory cell 21, reference cells 23a to 23c and dummy cell 12 each having its own threshold voltage are formed in the same series of the ion implantation processes, that is, these three successive ion implantation processes.

However, in the conventional multilevel mask ROM as above, when the reference cell is formed and concurrently the memory cell is built in accordance with the process shown in FIGS. 4A to 4D, the current which flows in the memory cell sometimes becomes smaller than the estimated current due to dispersion in the manufacturing process, resultantly approaching the reference current. Therefore, the operation margin of the comparison circuit is reduced, and in the worst case, there occurs the possibility of misjudgment of the data.

SUMMARY OF THE INVENTION

An object of the present invention is to provide a semiconductor ROM device which can obtain a reference current for securely distinguishing data stored in the memory cell.

Another object of the present invention is to provide a method of manufacturing the semiconductor ROM device which can obtain the reference current for securely distinguishing data stored in the memory cell.

The object of the present invention can be achieved by means of the semiconductor read only memory (ROM) device comprising: a semiconductor substrate; a memory cell having a first cell transistor, the first cell transistor having a threshold voltage in accordance with an amount of ions injected to a channel region of the first cell transistor, the threshold voltage corresponding to multilevel data of three or more levels to be stored in said memory cell; a reference cell provided on the semiconductor substrate and having a second cell transistor while setting up an amount of ions to be injected to a channel region of the second cell transistor, the reference cell being used for generating a reference current which is compared with a current read out from the memory cell to discriminate the data stored in the memory cell; and a dummy cell provided on the semiconductor substrate and having a third cell transistor disposed adjacent to the second cell transistor, the third cell transistor having a channel region into which ions are injected simultaneously with the ions injected to the channel region of the second cell transistor.

Another object of the present invention can be achieved by the method of manufacturing a semiconductor read only memory (ROM) device which comprises a memory cell having a first cell transistor with a threshold voltage in accordance with an amount of ions injected to a channel region of the first cell transistor, the threshold voltage corresponding to multilevel data of three or more levels to be stored in the memory cell; a reference cell having a second cell transistor for generating a reference current which is compared with a current read out from the memory cell to discriminate the data stored in the memory cell; and a dummy cell having a third cell transistor disposed adjacent to the second cell transistor, the method comprising the steps of: forming a resist film which is opened corresponding to the reference cell and the dummy cell disposed around the reference cell; and injecting ions simultaneously to the channel regions of the reference cell and the dummy cells by using the resist film as a mask.

The above and other objects, features, and advantages of the present invention will become apparent from the following description based on the accompanying drawings which illustrate an example of a preferred embodiment of the present invention.

DESCRIPTION OF THE PREFERRED EMBODIMENT

Figure 1:
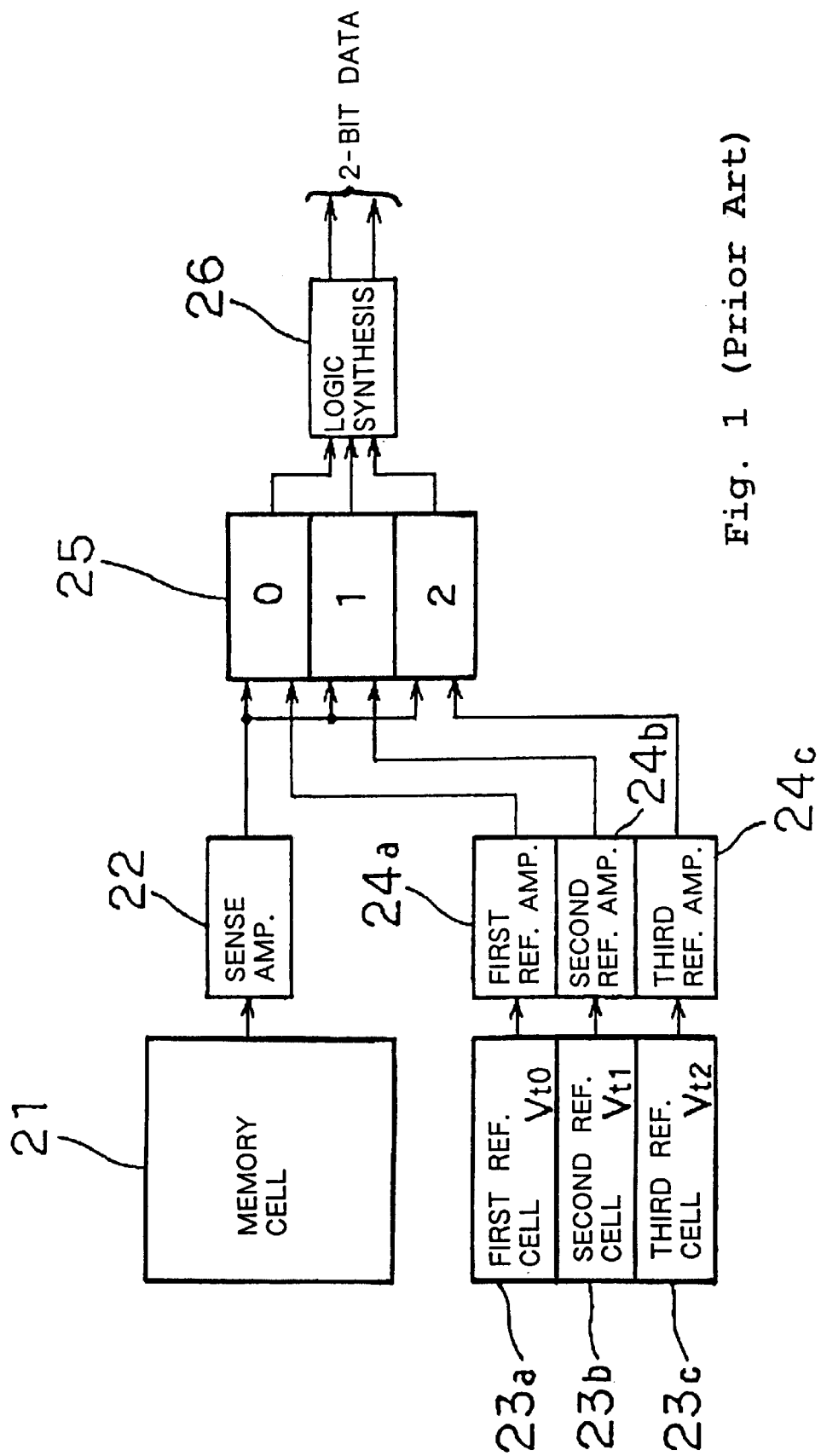
FIG. 1 is a block diagram showing the structure of a multilevel mask ROM.

Similarly with a conventional multilevel mask ROM shown in FIG. 1, a multilevel mask ROM according to a preferred embodiment of the present invention comprises a memory cell, reference cells, dummy cells, a sense amplifier, a reference amplifier, a comparison circuit and a logic synthesis circuit which having the same structure as those of the conventional multilevel mask ROM shown in FIG. 1 with the exception of the reference cells and the dummy cells. The difference is that in the multilevel mask ROM of the present embodiment, ions are concurrently injected to the reference cell for which a threshold voltage is to be set up and the dummy cell disposed adjacent to the reference cell with same ion implantation process. As a result, since the same amount of ions are injected to a channel region of the reference cell and a channel region of the dummy cell neighboring the reference cell, threshold voltages of those reference cells $V_{r1}$, $V_{r2}$ and associated dummy cells are set up to the equivalent.

Of course, in some case ion implantation is not performed to a certain reference cell $V_{r0}$ according to the threshold voltages to be set up to the reference cell. In such a case, as described later, ion implantation is performed to the channel region of the dummy cell neighboring the reference cell so that the maximum threshold voltage ($V_{r3}$ is used. Thus, reference cells for $V_{r1}$ and $V_{r2}$ are each surrounded by dummy cells having the same ion implant used for the respective reference cell, whereas, the $V_{r0}$ reference cell is surrounded by dummy cells at different ion implant level $V_{r3}$.

The ion implantation process will be described below with reference to the 4-level mask ROM.

Figure 5:
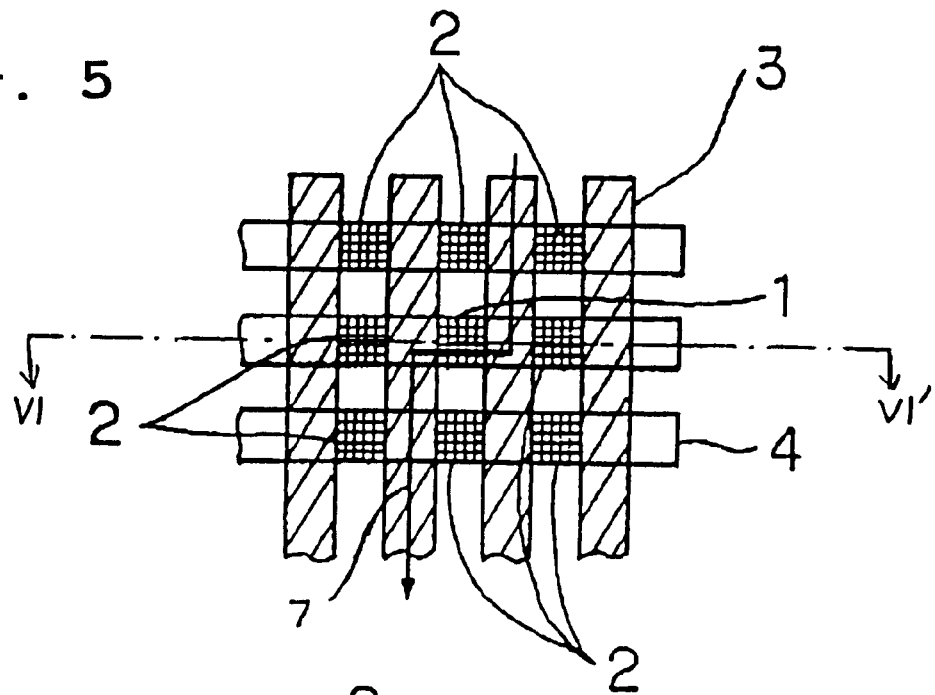
FIG. 5 is a plan showing the structure of the reference cell region of a multilevel mask ROM according to a preferable embodiment of the present invention.
Figure 6:
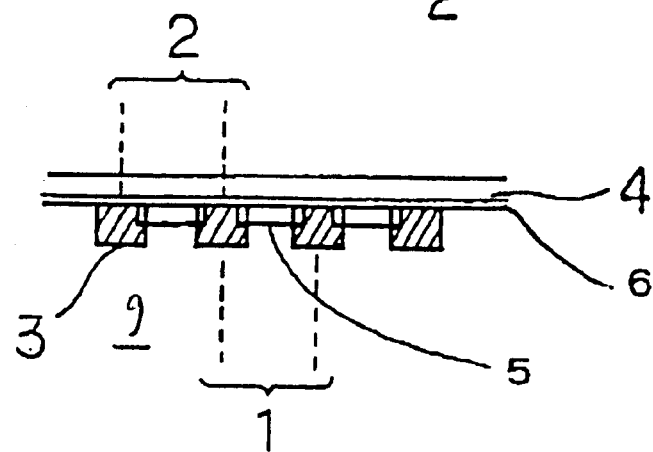
FIG. 6 is a sectional side elevation viewed from the VI–VI' line of FIG. 5.

As shown in FIGS. 5 and 6, the reference cell region of the mask ROM according to the present embodiment is composed of p-type silicon semiconductor substrate 9, a plurality of parallelly disposed buried diffusion layers 3 each made of n+-type silicon layer formed on the p-type silicon semiconductor substrate 9, and a plurality of parallelly disposed gate lines 4 made of polysilicon being arranged orthogonally to buried diffusion layers 3. Gate line 4 is provided through oxide film 6 on the surface of p-type silicon semiconductor substrate 9 inclusive buried diffusion layer 3. Therefore, areas between gate line 4 and channel region 5, and between gate line 4 and buried diffusion layer 3 are insulated by oxide film 6. Buried diffusion layer 3 serves as a source region and a drain region of a cell transistor which is a MOSFET and gate line 4 serves a s a gate e lec trode of the cell transistor. Oxide film 6 functions as a gate oxide film.

In FIG. 5 nine cell transistors are illustrated, the cell transistor in the center of the figure being reference cell 1. In channel region 5 provided directly under the gate of reference cell 1, ions are injected to set the threshold voltage of reference cell 1 to a desired value, and around reference cell 1, dummy cell s 2 are disposed being formed with the same structure as that of reference cell 1.

Next, the manufacturing process of the reference cell shown in FIGS. 5 and 6 are described with reference to FIGS. 7A to 7D for reference cells $V_{r1}$ and $V_{r2}$. Now, the following description will be made, for example, with reference to the case in which the threshold voltage of reference cell 1 is set to $V_{r1}$. The area of FIGS. 7A to 7D attached with cross hatching each shows that ion implantation is applied thereto in the corresponding stage.

As described above, in the 4-level mask ROM, reference cells having threshold voltages set to $V_{r0}$, $V_{r1}$ and $V_{r2}$, respectively, are provided. FIGS. 7A to 7D each shows only the reference cell in which the threshold voltage is set to $V_{r1}$, and reference cells having other threshold voltages set to $V_{r0}$ and $V_{r2}$ are provided outside the regions shown in FIGS. 7A to 7D. Thus, when the threshold voltage is set to $V_{r2}$, ions would be injected in a second ion implantation process later described to form the $V_{r2}$ reference cell. When the threshold voltage is set to $V_{r0}$, ion implantation is controlled not to be applied to the $V_{r0}$ reference cell.

Figure 2:
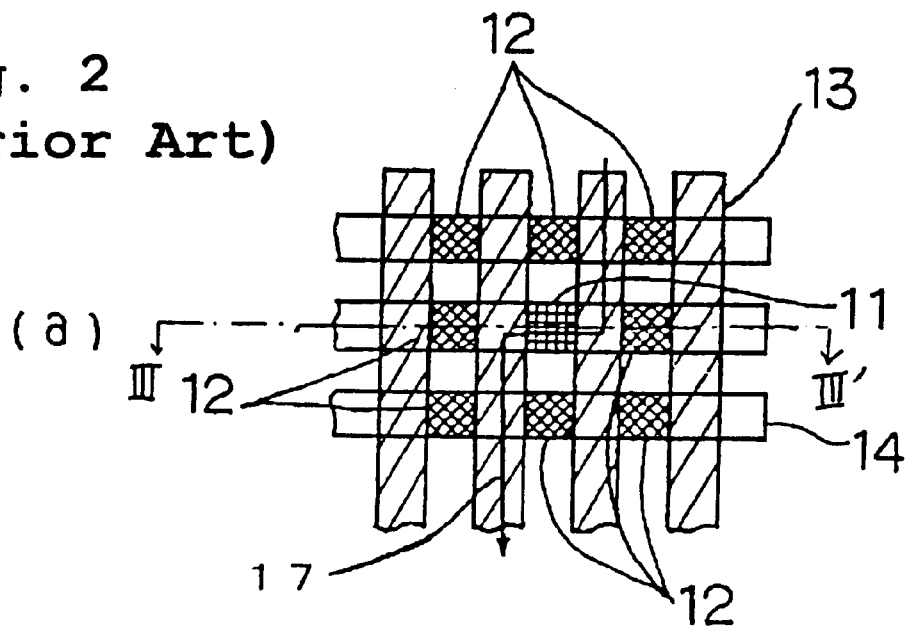
FIG. 2 is a plan showing the structure of a reference cell region of a conventional multilevel mask ROM.
Figure 3:
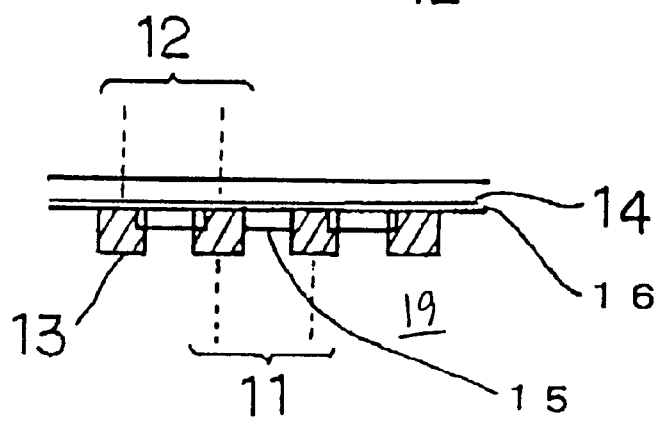
FIG. 3 is a sectional side elevation viewed from the III—III line of FIG. 2.
Figure 4A:
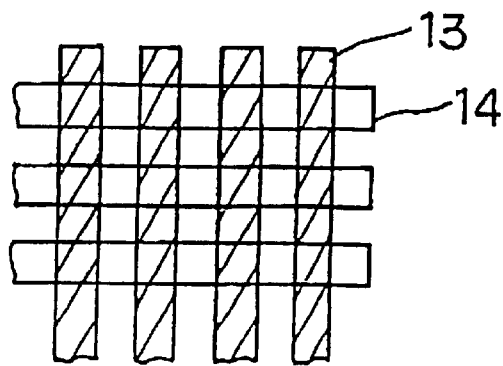
FIGS. 4A to 4D are plans explaining in order the manufacturing process with regard to the reference cell shown in FIG. 2.
Figure 4B:
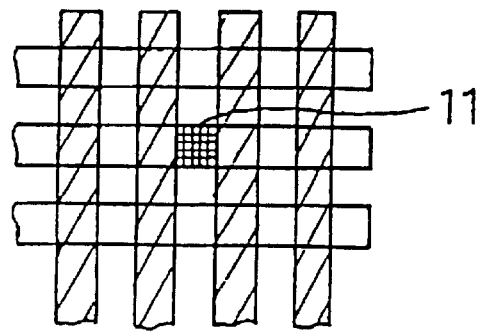
Figure 4C:
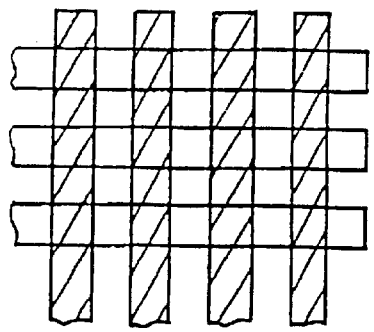
Figure 4D:
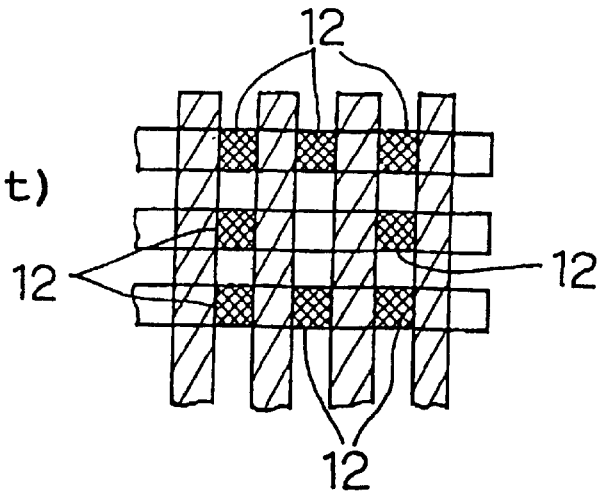
Figure 7A:
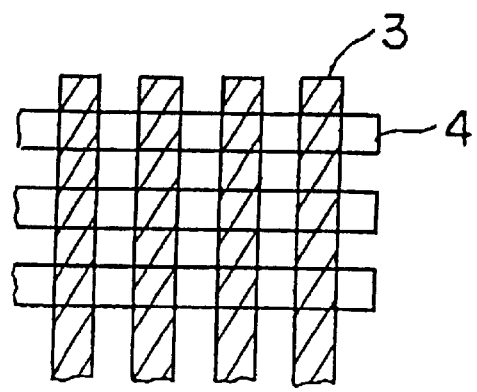
FIGS. 7A to 7D are plans explaining in order the manufacturing process of the reference cells $V_{r1}$ and $V_{r2}$ shown in FIG. 5.
Figure 7B:
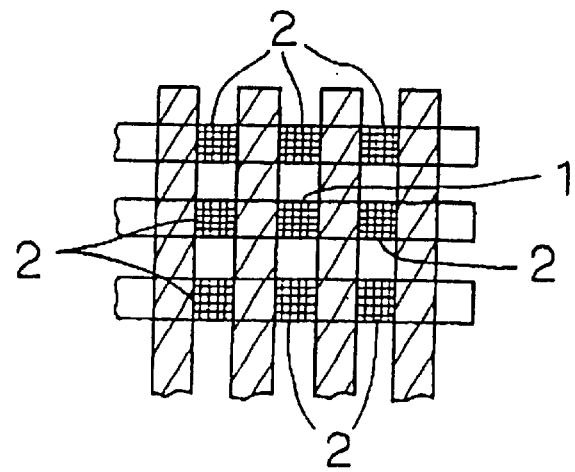
Figure 7C:
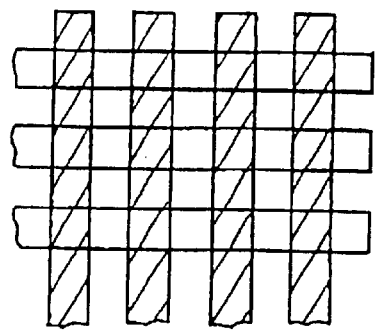
Figure 7D:
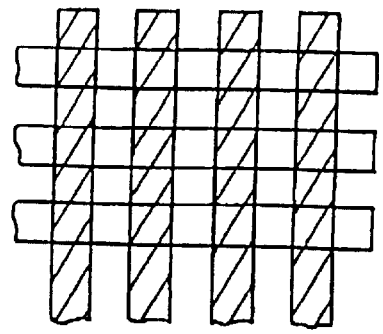
Figure 8A:
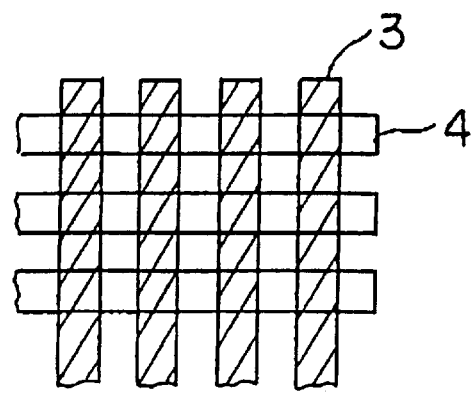
FIGS. 8A to 8D are plans explaining in order the manufacturing process of another reference cell $V_{r0}$ shown in FIG. 5.
Figure 8B:
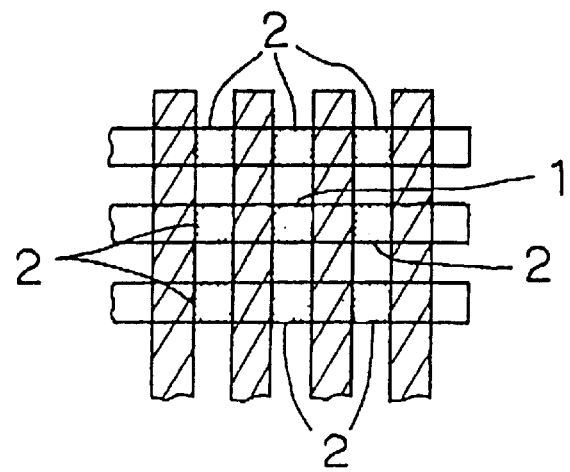
Figure 8C:
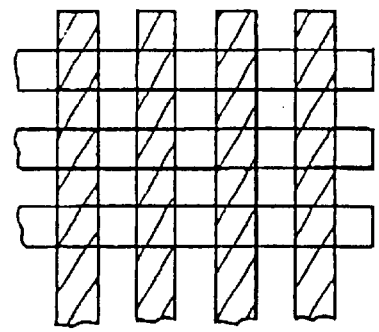
Figure 8D:
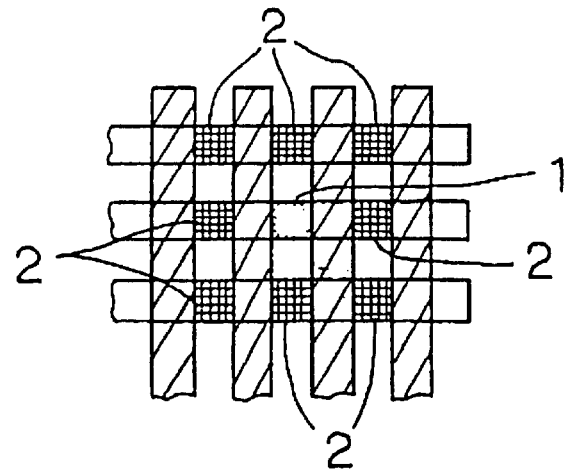

In this case, as shown in FIG. 7A, buried diffusion layer 3 and oxide film 6 are first formed on p-type silicon substrate 9 to form the mask ROM substrate. At this stage, no ion implantation is applied to channel region 5. A resist film for ion implantation having openings prepared corresponding to reference cell 1 and dummy cells 2 is formed on the mask ROM substrate. Next, as shown in FIG. 4B, a first ion implantation process for injecting ions into channel region 15 (see FIG. 2) by an amount required for setting the threshold voltage to $V_{r1}$ is performed thereby forming reference cell 1 and dummy cells 2. Successively, a second ion implantation process for setting the threshold voltage to $V_{r2}$ is performed in the same way as the first ion implantation process. It is noted that since the threshold voltage of reference cell 1 shown in FIGS. 7A to 7D is set to $V_{r1}$, since the resist film formed on this region has no opening, and as shown in FIG. 7C, no ions are injected into this region through the second ion implantation process. Finally, on the mask ROM substrate for which the second ion implantation process is finished, a third ion implantation process (FIG. 7D) for implanting a required amount of ions for setting the threshold voltage to $V_{r3}$ is performed. Since the threshold voltage of reference cell 1 is set to $V_{r1}$ and the threshold voltage of dummy cell 2 is also set to $V_{r1}$, as shown in FIG. 7D, no ions are injected into this region shown in the figure through the third ion implantation process. Thereafter, gate electrode 4 is formed to complete the mask ROM.

Description has been made above with reference to the case in which the threshold voltage of the reference cell is set to $V_{r1}$, however, when the threshold voltage of the reference cell is set to $V_{r2}$, the threshold voltage of dummy cells disposed around the reference cell of $V_{r2}$ are also set to $V_{r2}$.

Thus, FIGS. 7A–7D apply similarly for reference cell $V_{r2}$, except the $V_{r2}$ reference cell masks are open only for the $V_{r2}$ implant.

In the other case in which the threshold voltage of the reference cell is set to $V_{r0}$ which does not require ion implantation, the threshold voltage of dummy cells disposed around the reference cell of $V_{r0}$ is set to the highest voltage $V_{r3}$. FIGS. 8A to 8D shows in order the manufacturing process of the reference cell of $V_{r0}$, FIG. 8A corresponding to the state when the mask ROM substrate is prepared, FIG. 8B corresponding to the first ion implantation process, FIG. 8C corresponding to the second ion implantation process and FIG. 8D corresponding to the third ion implantation process. As shown in FIGS. 8A to 8D, no ions are injected to reference cell 1 through the first, second and third ion implantation processes, and ions are injected to dummy cells 2 in the third ion implantation process.

Manufacturing processes have been described above concerning the reference cell with the threshold voltage $V_{r0}$ and the dummy cells disposed around it, the reference cell with the threshold voltage $V_{r1}$ and the dummy cells disposed around it, and the reference cell with the threshold voltage $V_{r2}$ and the dummy cells disposed around it, respectively. However, practically, by executing the first ion implantation process, the second ion implantation process and the third ion implantation process, only one time each and in order while changing every time a pattern of the exposure mask to be used in the photolithographic process for the entire ROM memory area, all memory cells in the 4-level mask ROM, all reference cells and all dummy cells are produced using the three ion implant levels.

Generally, the diameter of the opening made in the resist film through a photolithographic process tends to become larger as the density of openings per unit area increases more. According to the manufacturing method of the present embodiment, regarding the reference cell whose threshold voltage is $V_{t1}$, the reference cell and dummy cells 2 disposed around it are formed at once in the first ion implantation process. By applying the manufacturing method like this, the diameter of the opening for the reference cell which is opened in the resist film becomes larger compared to the opening of the case in which only the reference cell is produced in the first ion implantation process and dummy cells are produced in the third ion implantation process as in the conventional method. As shown in FIG. 6, ions injected to channel region 5 of the cell transistor of reference cell 1 diffuse into buried diffusion layer 3 which functions as the source region and the drain region of the cell transistor. According to the manufacturing method of the present embodiment, the diameter of the opening of the resist film provided for the reference cell becomes larger compared to the opening of the conventional method, and hence the amount of ions diffuse into buried diffusion layer 3 increases than before. Therefore, along with the increase of the threshold voltage of the reference cell, the resistance of buried diffusion layer 3 becomes larger than that of the conventional 4-level mask ROM and a current flows in the reference cell is reduced. If it is assumed that the power source is in the upper direction and the ground potential is in the lower direction of FIG. 5, the path of the current which flows in the reference cell becomes, for example, like current path 7 shown in FIG. 5.

Similarly, concerning the reference cell in which the threshold voltage is set to $V_{t2}$, since the reference cell and dummy cells disposed around it are simultaneously produced by the second ion implantation process, the threshold voltage of the reference cell is increased and concurrently the resistance of the buried diffusion layer is augmented, thereby causing the current in the reference cell to reduce.

However with reference to the reference cell whose threshold voltage is set to $V_{t0}$, since ion implantation to inject ions into the channel region of this reference cell is not performed, it is unable to reduce the current in the reference cell in the same manner as that for the reference cell whose threshold voltage is $V_{t1}$ or $V_{t2}$. Therefore, by utilizing the technique disclosed in above Japanese Patent Laid-open Gazette No. 55094/1997, ion implantation is performed in such a manner that the highest threshold voltage $V_{t3}$ is set to dummy cells neighboring the reference cell of $V_{t3}$ into which no ions are injected.

Figure 9:
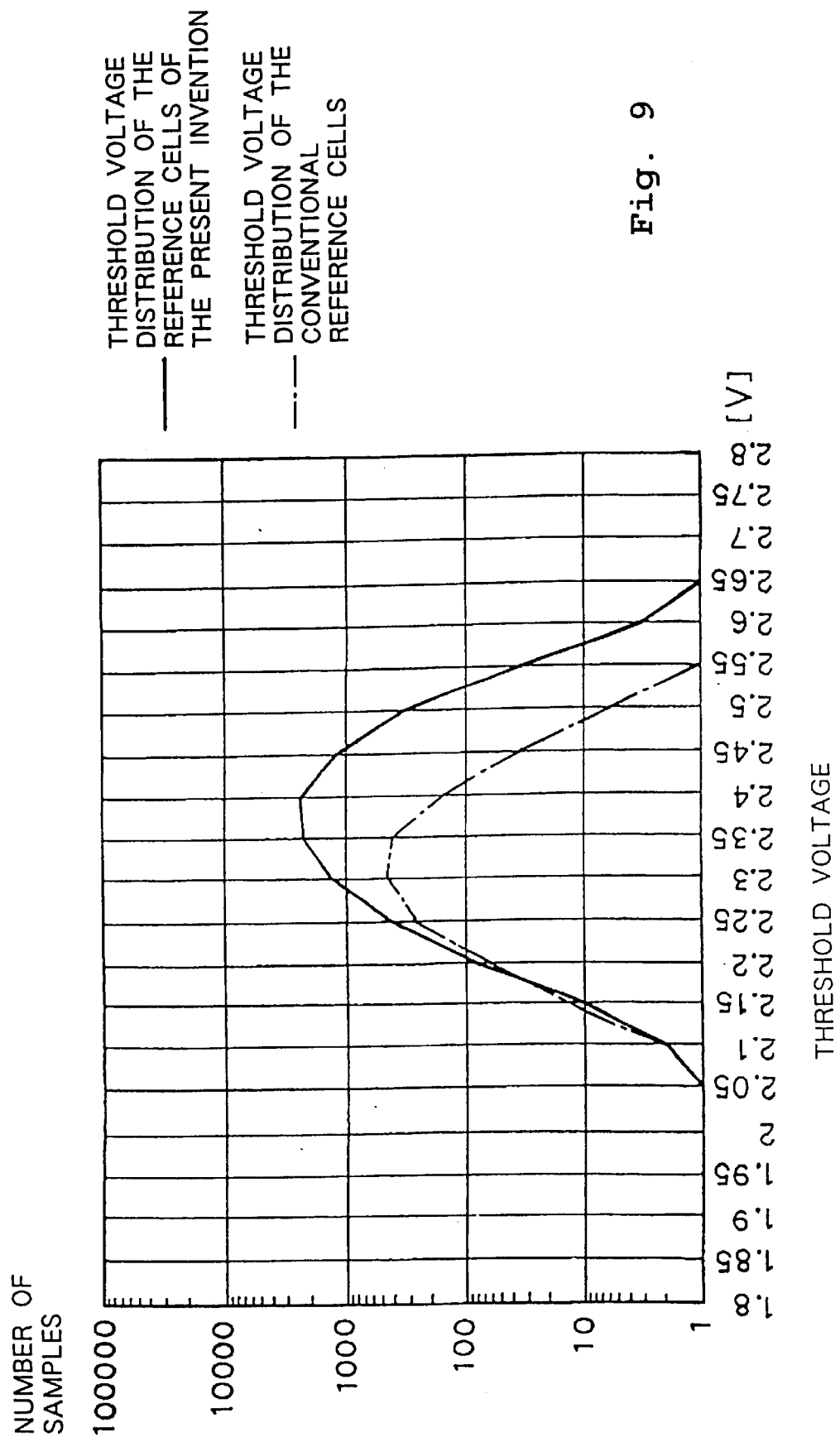
FIG. 9 is a graph showing distribution of the threshold voltages of the reference cells of the mask ROMs manufactured according to the method of the present invention and the conventional method.

When a number of reference cells of the 4-level mask ROM whose threshold voltage is to be $V_{t1}$ are formed, after surveying how the threshold voltages of these reference cells are actually distributed, FIG. 9 shows the results in a graph. In this graph, the distribution of the threshold voltages of the reference cells manufactured in the conventional process shown in FIGS. 4A to 4D is shown by a chain line, and the distribution of the threshold voltages of the reference cells manufactured in the process of the present invention shown in FIGS. 7A to 7D is shown by a solid line.

As shown in FIG. 9, the threshold voltage of the reference cell manufactured according to the method of the present embodiment is shifted to the higher value side compared to the conventional reference cell, thereby causing the reference current to be reduced. Therefore, since the current flows in the reference cell approaches the minimum value of the current in the memory cell, the operation margin of the comparison circuit of the mask ROM is increased.

Further in the present embodiment, since the reference cell and dummy cells surrounding thereof are formed by the ion implantation process the same as that of the memory cell of the corresponding threshold voltage, the dispersion of the opening diameter in the resist film of the reference cell and the dispersion in that of the memory cell become similar, thereby making the current in the reference cell further approach the current in the memory cell. Accordingly, data stored in the memory cell can securely be reproduced.

In the above explanation, although eight pieces of dummy cells are arranged in such a manner to surround one reference cell, it is not necessary to surround the reference cell by eight pieces of dummy cells, but it is acceptable if at least four pieces of dummy cells are disposed for one reference cell. For example, if cell transistors are arranged in a form of a matrix, it is enough if dummy cells are disposed at four spots in the vertical direction and in the right and left direction, respectively.

Further, if a dummy cell having the threshold voltage set to the highest voltage ($V_{t3}$) is provided on the current route of the reference cell between the power source and the ground potential, the current which flows in the reference cell is further reduced thereby enabling the current in the reference cell to approach the minimum current which flows in the memory cell.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor read only memory (ROM) device comprising:
    a semiconductor substrate;
    a data memory cell provided on said semiconductor substrate, said data memory cell comprising a data cell transistor, said data cell transistor having a data cell transistor threshold voltage corresponding to a predetermined one of multilevel data of three or more levels that can be stored in said data memory cell, said data cell transistor threshold voltage causing a current level to flow from said data cell transistor during a data read operation;
    a reference cell provided on said semiconductor substrate, said reference cell comprising a reference cell transistor having a reference cell threshold voltage corresponding to a predetermined one of said multilevel data of three or more levels, said reference cell being used for generating a reference current which is compared with said current read out from said data memory cell to discriminate the data stored in said data memory cell; and
    at least one dummy cell provided on said semiconductor substrate, each said dummy cell comprising a dummy cell transistor, said dummy cell transistor disposed adjacent to said reference cell transistor, said dummy cell transistor having a dummy cell threshold voltage corresponding to a predetermine d one of said multilevel data of three or more levels, wherein said dummy cell threshold voltage equals said reference cell threshold voltage.

2. The semiconductor ROM device according to claim 1, wherein each of said data cell transistor, said reference cell transistor and said dummy cell transistor comprises a MOSFET (metal-oxide-silicon field effect transistor) of a same structure.

3. The semiconductor ROM device according to claim 1, wherein said multilevel data is 4-level data.

4. The semiconductor ROM device according to claim 1, further comprising:

a plurality of reference, cells and dummy cells, wherein at least four dummy cell transistors are disposed surrounding each reference cell transistor.

5. The semiconductor ROM device according to claim 4, wherein said reference cell transistors and said dummy cell transistors are disposed such that eight said dummy cell transistors are disposed surrounding each said reference cell transistor.

6. The semiconductor ROM device according to claim 1, further comprising:

a second reference cell having a second reference cell transistor having a threshold voltage set a lowest value of said three or more levels; and a second dummy cell provided on said semiconductor substrate and having a second dummy cell transistor disposed adjacent to said second reference cell trasnsistor, said second dummy cell transistor having a threshold voltage set to a highest value of said three or more levels.

7. A semiconductor read only memory (ROM) device comprising:

a plurality of data memory cells, each said data memory cell comprising a transistor having a predetermined threshold voltage corresponding to one of a predetermined number of possible values that can be stored in each said data memory cell;

a plurality of reference cells, each said reference cell comprising a transistor having a unique predetermined threshold voltage, each said reference cell used for generating a reference current compared with a current read out from each of said memory cells to discriminate the data stored therein; and at least one dummy cell adjacent to each said reference cell, each said dummy cell comprising a transistor having a predetermined threshold voltage, wherein at least one of said plurality of reference cells has a corresponding dummy cell having said threshold voltage matching said threshold voltage of said corresponding reference cell.

8. The semicondutor read only memory (ROM) device of claim 7, wherein at least one of said plurality of reference cell comprises a reference cell transistor having a threshold voltage different from a threshold of a dummy a cell transistor of said adjacent dummy cell.

9. A semiconductor read only memory (ROM) device having a multilevel data memory capability, said ROM device comprising:

a plurality of data memory cells, each said data memory cell comprising a data cell transistor, each said data cell transistor having a data cell threshold voltage corresponding to a predetermined one of N multilevel data values, said data cell threshold voltage causing a data cell current to flow during a data retrieval process; and at least N−1 reference cell regions, each said reference cell region comprising a centrally-located reference cell transistor surrounded by a plurality of dummy cell transistors, said reference cell transistor having a predetermined reference cell transistor threshold voltage to provide a reference cell current for comparison with said data cell current, said surrounding dummy cell transistors each having a dummy cell transistor threshold voltage, wherein, for at least N−2 of said at least N−1 reference cell regions, a value of said dummy cell transistor threshold voltage of each said dummy cell transistor surrounding said centrally-located reference cell transistor equals a value of said centrally-located reference cell transistor threshold voltage.

* * * * *